(12) United States Patent
Farahvash et al.

(10) Patent No.: US 11,245,432 B2
(45) Date of Patent: Feb. 8, 2022

(54) RADIO FREQUENCY DEVICE WITH INTEGRATED ANTENNA TUNER AND MULTIPLEXER

(71) Applicant: Skyworks Solutions, Inc., Irvine, CA (US)

(72) Inventors: Shayan Farahvash, Tarzana, CA (US); Weimin Sun, Santa Rosa Valley, CA (US); John C. Baldwin, Simi Valley, CA (US); Joel Richard King, Newbury Park, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/810,684

(22) Filed: Mar. 5, 2020

(65) Prior Publication Data

US 2020/0287583 A1    Sep. 10, 2020

Related U.S. Application Data

(60) Provisional application No. 62/814,783, filed on Mar. 6, 2019.

(51) Int. Cl.
*H04B 1/40* (2015.01)
*H03H 7/38* (2006.01)

(52) U.S. Cl.
CPC ............. *H04B 1/40* (2013.01); *H03H 7/38* (2013.01)

(58) Field of Classification Search
CPC ... H04B 1/40; H04B 1/44; H04B 1/04; H04B 2001/0408; H04B 1/0458; H03H 7/38
See application file for complete search history.

(56) References Cited

U.S. PATENT DOCUMENTS

| | | |
|---|---|---|
| 6,497,324 B1 | 12/2002 | Doak et al. |
| 8,208,884 B2 | 6/2012 | Zhao et al. |
| 8,331,887 B2 | 12/2012 | Tuttle et al. |
| 8,503,962 B2 | 8/2013 | Rafi et al. |
| 8,526,897 B2 | 9/2013 | Henson |
| 8,571,512 B2 | 10/2013 | Rafi |
| 8,576,343 B2 | 11/2013 | Hendrickson et al. |
| 8,599,312 B2 | 12/2013 | Hendrickson et al. |
| 8,605,224 B2 | 12/2013 | Trager |
| 8,928,820 B2 | 1/2015 | Coban et al. |
| 9,041,472 B2 | 5/2015 | Chen et al. |
| 9,100,109 B2 * | 8/2015 | Schmidhammer ....... H03H 7/40 |
| 9,496,913 B2 | 11/2016 | King et al. |
| 9,531,413 B2 | 12/2016 | Sun et al. |
| 9,621,129 B2 | 4/2017 | Domino et al. |
| 9,647,703 B2 | 5/2017 | Sun et al. |
| 9,660,584 B2 | 5/2017 | Modi et al. |
| 9,660,609 B2 | 5/2017 | Reisner et al. |

(Continued)

*Primary Examiner* — Nguyen T Vo

(74) *Attorney, Agent, or Firm* — Knobbe, Martens, Olson & Bear, LLP

(57) ABSTRACT

Radio frequency communication systems with a combined antenna impedance tuning and antenna multiplexing functionality are provided. In certain embodiments, a packaged radio frequency module includes an antenna multiplexer and an antenna impedance tuner. The module can be configured to provide impedance matching between one or more radio frequency front end modules and an antenna. The antenna impedance tuner can supplement antenna tuning provided by an antenna aperture separately connected to the antenna.

19 Claims, 13 Drawing Sheets

(56) References Cited

U.S. PATENT DOCUMENTS

| | | |
|---|---|---|
| 9,787,388 B1 | 10/2017 | Croman et al. |
| 9,847,755 B2 | 12/2017 | Sun et al. |
| 9,866,268 B2 | 1/2018 | King et al. |
| 10,075,199 B2 | 9/2018 | King et al. |
| 10,090,812 B2 | 10/2018 | Modi et al. |
| 10,103,754 B2 | 10/2018 | King |
| 10,128,558 B2 | 11/2018 | Sun et al. |
| 10,128,930 B2 | 11/2018 | Croman et al. |
| 10,205,490 B2 * | 2/2019 | Wloczysiak ............. H04B 1/18 |
| 10,211,857 B2 | 2/2019 | King et al. |
| 10,224,977 B2 | 3/2019 | Sun et al. |
| 10,230,413 B2 | 3/2019 | Wloczysiak et al. |
| 10,257,119 B2 | 4/2019 | Wloczysiak et al. |
| 10,374,578 B2 | 8/2019 | Domino et al. |
| 10,396,753 B2 | 8/2019 | Reisner et al. |
| 10,454,506 B2 | 10/2019 | King et al. |
| 10,554,177 B2 | 2/2020 | Lyalin et al. |
| 10,554,197 B2 | 2/2020 | Domino et al. |
| 10,622,969 B2 | 4/2020 | Kishino |
| 10,623,046 B2 | 4/2020 | Sun et al. |
| 10,623,337 B2 | 4/2020 | Wloczysiak et al. |
| 10,693,422 B2 | 6/2020 | Pan et al. |
| 10,771,096 B2 | 9/2020 | Domino |
| 10,778,174 B2 | 9/2020 | Ta et al. |
| 10,834,356 B1 | 11/2020 | Gaxiola-Sosa et al. |
| 10,892,715 B2 | 1/2021 | Pan et al. |
| 10,931,253 B2 | 2/2021 | Ta et al. |
| 10,985,784 B2 | 4/2021 | King |
| 11,038,471 B2 | 6/2021 | Drogi et al. |
| 11,070,174 B2 | 7/2021 | Lyalin et al. |
| 11,095,575 B2 | 8/2021 | Wloczysiak et al. |
| 2007/0135062 A1 * | 6/2007 | Hwang ................. H04B 1/006 455/80 |
| 2007/0149146 A1 * | 6/2007 | Hwang ............. H01Q 21/0025 455/80 |
| 2009/0109880 A1 * | 4/2009 | Kim ........................ H04B 1/50 370/278 |
| 2009/0213275 A1 | 8/2009 | Trager |
| 2010/0233987 A1 | 9/2010 | Rafi et al. |
| 2010/0328536 A1 | 12/2010 | Hendrickson et al. |
| 2010/0328544 A1 | 12/2010 | Hendrickson et al. |
| 2011/0098008 A1 | 4/2011 | Zhao et al. |
| 2011/0158298 A1 | 6/2011 | Djadi et al. |
| 2011/0158339 A1 | 6/2011 | Tuttle et al. |
| 2012/0099625 A1 | 4/2012 | Djadi et al. |
| 2012/0108191 A1 | 5/2012 | Henson |
| 2013/0178183 A1 | 7/2013 | Rafi |
| 2014/0002188 A1 | 1/2014 | Chen et al. |
| 2014/0233441 A1 * | 8/2014 | Lee ....................... H03H 7/463 370/297 |
| 2014/0267928 A1 | 9/2014 | Coban et al. |
| 2015/0003306 A1 | 1/2015 | Domino et al. |
| 2015/0312018 A1 * | 10/2015 | Li ........................ H04B 1/0057 370/278 |
| 2015/0326181 A1 | 11/2015 | Chen et al. |
| 2015/0326182 A1 | 11/2015 | Chen et al. |
| 2015/0326183 A1 | 11/2015 | Chen et al. |
| 2016/0142035 A1 * | 5/2016 | De Foucauld ....... H04B 1/0458 343/861 |
| 2016/0380594 A1 | 12/2016 | Sun et al. |
| 2017/0012603 A1 | 1/2017 | Reisner et al. |
| 2017/0012651 A1 * | 1/2017 | Ella ........................ H04B 1/0064 |
| 2017/0195106 A1 * | 7/2017 | Pehlke ................... H04B 1/006 |
| 2017/0257070 A1 | 9/2017 | Modi et al. |
| 2017/0279436 A1 | 9/2017 | Domino et al. |
| 2017/0279437 A1 | 9/2017 | Domino et al. |
| 2017/0288764 A1 | 10/2017 | Croman et al. |
| 2017/0324395 A1 | 11/2017 | Reisner et al. |
| 2018/0019768 A1 | 1/2018 | King et al. |
| 2018/0026701 A1 | 1/2018 | Croman et al. |
| 2018/0062682 A1 | 3/2018 | Wloczysiak et al. |
| 2018/0063031 A1 | 3/2018 | Wloczysiak et al. |
| 2018/0131333 A1 * | 5/2018 | Cabanillas ............. H03F 3/189 |
| 2018/0269854 A1 | 9/2018 | Kishino |
| 2018/0309528 A1 | 10/2018 | King |
| 2019/0007073 A1 | 1/2019 | King et al. |
| 2019/0149178 A1 | 5/2019 | King et al. |
| 2019/0165738 A1 | 5/2019 | Pan et al. |
| 2019/0165739 A1 | 5/2019 | Lyalin et al. |
| 2019/0165752 A1 | 5/2019 | Ta et al. |
| 2019/0230051 A1 | 7/2019 | Wloczysiak et al. |
| 2019/0253087 A1 | 8/2019 | Domino |
| 2019/0273523 A1 | 9/2019 | Wloczysiak et al. |
| 2020/0028479 A1 | 1/2020 | Ta et al. |
| 2020/0028481 A1 | 1/2020 | Sun et al. |
| 2020/0028489 A1 | 1/2020 | Ta et al. |
| 2020/0028492 A1 | 1/2020 | Ta et al. |
| 2020/0028493 A1 | 1/2020 | Ta et al. |
| 2020/0091890 A1 | 3/2020 | Reisner et al. |
| 2020/0162030 A1 | 5/2020 | Drogi et al. |
| 2020/0162114 A1 | 5/2020 | King et al. |
| 2020/0177226 A1 * | 6/2020 | Cha ........................ H04B 1/401 |
| 2020/0186202 A1 | 6/2020 | Baldwin et al. |
| 2020/0244597 A1 | 7/2020 | Wloczysiak et al. |
| 2020/0280296 A1 * | 9/2020 | Mori ..................... H03H 7/461 |
| 2020/0287583 A1 | 9/2020 | Farahvash et al. |
| 2020/0336113 A1 | 10/2020 | Pan et al. |
| 2020/0382070 A1 | 12/2020 | Lyalin et al. |
| 2021/0044308 A1 | 2/2021 | Domino |
| 2021/0058051 A1 | 2/2021 | Ta et al. |
| 2021/0075992 A1 | 3/2021 | Gaxiola-Sosa et al. |
| 2021/0099135 A1 | 4/2021 | Balteanu et al. |
| 2021/0119598 A1 | 4/2021 | Ta et al. |
| 2021/0135631 A1 | 5/2021 | Pan et al. |
| 2021/0175865 A1 | 6/2021 | Lee |
| 2021/0175913 A1 | 6/2021 | Domino |
| 2021/0218370 A1 | 7/2021 | Balteanu et al. |
| 2021/0273614 A1 | 9/2021 | Drogi et al. |

* cited by examiner

RADIO FREQUENCY DEVICE WITH INTEGRATED ANTENNA TUNER AND MULTIPLEXER

CROSS-REFERENCE TO RELATED APPLICATIONS

This application claims the benefit of priority under 35 U.S.C. § 119 of U.S. Provisional Patent Application No. 62/814,783, filed Mar. 6, 2019, and titled "RADIO FREQUENCY DEVICE WITH INTEGRATED ANTENNA TUNER AND MULTIPLEXER," which is herein incorporated by reference in its entirety.

BACKGROUND

Technical Field

Embodiments of the invention relate to electronic systems, and in particular, to radio frequency (RF) electronics.

Description of the Related Technology

Antenna tuners and multiplexers are used in RF communication systems to improve signal transmission and reception. Examples of RF communication systems that can include these components include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for certain communications standards.

SUMMARY

According to certain aspects of the disclosure, a radio frequency module includes a front-end signal module port and an antenna signal module port. The radio frequency module further includes an antenna multiplexer including two or more first ports, and a second port coupled to the antenna signal module port. The multiplexer can be configured to couple the second port to one or more of the first ports. The module further includes an antenna impedance tuner including a front-end side port coupled to the front-end signal module port, a multiplexer-side port coupled to one of the first ports of the antenna multiplexer, and tuning circuitry connected between the front-end side port and the multiplexer-side port and controllable to provide adjustable impedance matching.

The antenna impedance tuner can be configured to provide adjustable impedance matching between an antenna coupled to the antenna signal module port and an output of a power amplifier that generates a radio frequency transmit signal received on the front-end signal module port. The antenna impedance tuner can include a pi network.

The module can include a module packaging housing the antenna multiplexer and the antenna impedance tuner. The module can further include at least one control module port configured to receive one or more control signals. The tuning circuitry can include a plurality of switches configured to switch in response to the control signals to adjust the impedance matching. The module can further include a second antenna impedance tuner coupled to another one of the first ports of the antenna multiplexer.

The antenna multiplexer can include a multiplexer/demultiplexer configured to multiplex in a transmit direction and demultiplex in a receive direction. The antenna multiplexer can includes a separate filter for each of the one or more first ports, where each filter may be configured to pass a different range of frequency content.

According to additional aspects, a mobile device includes an antenna and a power amplifier configured to amplify a radio frequency transmit signal. The mobile device further includes a packaged module including a front-end signal module port, an antenna signal module port, an antenna multiplexer, and an antenna impedance tuner. The multiplexer can include two or more first ports, and a second port coupled to the antenna signal module port. The multiplexer can be configured to couple the second port to one or more of the first ports. The impedance tuner can include a front-end side port coupled to the front-end signal module port, a multiplexer-side port coupled to one of the first ports of the multiplexer, and tuning circuitry connected between the front-end side port and the multiplexer-side port and controllable to provide adjustable impedance matching between the power amplifier and the antenna.

The mobile device can include a directional coupler coupled in a radio frequency communication path between the power amplifier and the antenna impedance tuner. The mobile can also include a processor configured to control the antenna impedance tuner to adjust the impedance matching, based on signals received from the directional coupler.

The mobile device can include an aperture tuner coupled to the antenna.

The antenna multiplexer of the mobile device can be a multiplexer/demultiplexer configured to multiplex in a transmit direction and demultiplex in receive direction. The impedance tuner of the mobile device can include a pi network.

According to yet further aspects, a radio frequency module includes an antenna signal module port and a power amplifier configured to amplify a radio frequency transmit signal. The module can further include an antenna multiplexer including two or more first ports, and a second port coupled to the antenna signal module por. The multiplexer can be configured to couple the second port to one or more of the first ports. The module can further include an antenna impedance tuner including a front end-side port configured to receive the amplified radio frequency transmit signal, a multiplexer-side port coupled to one of the first ports of the antenna multiplexer, and tuning circuitry connected between the front-end side port and the multiplexer-side port and controllable to provide adjustable impedance matching.

The module can additionally include a module packaging housing the power amplifier, antenna multiplexer and antenna impedance tuner.

The antenna impedance tuner of the module can be configured to provide adjustable impedance matching between an antenna coupled to the antenna signal module port and an output of the power amplifier. The antenna multiplexer can be a multiplexer/demultiplexer configured to multiplex in a transmit direction and demultiplex in a receive direction. The antenna impedance tuner can include a pi network. The antenna multiplexer can include a splitter/combiner.

The module can include at least one control module port configured to receive one or more control signals. The tuning circuitry can include a plurality of switches configured to switch in response to the control signals to adjust the impedance matching.

DETAILED DESCRIPTION OF CERTAIN EMBODIMENTS

Figure 1:
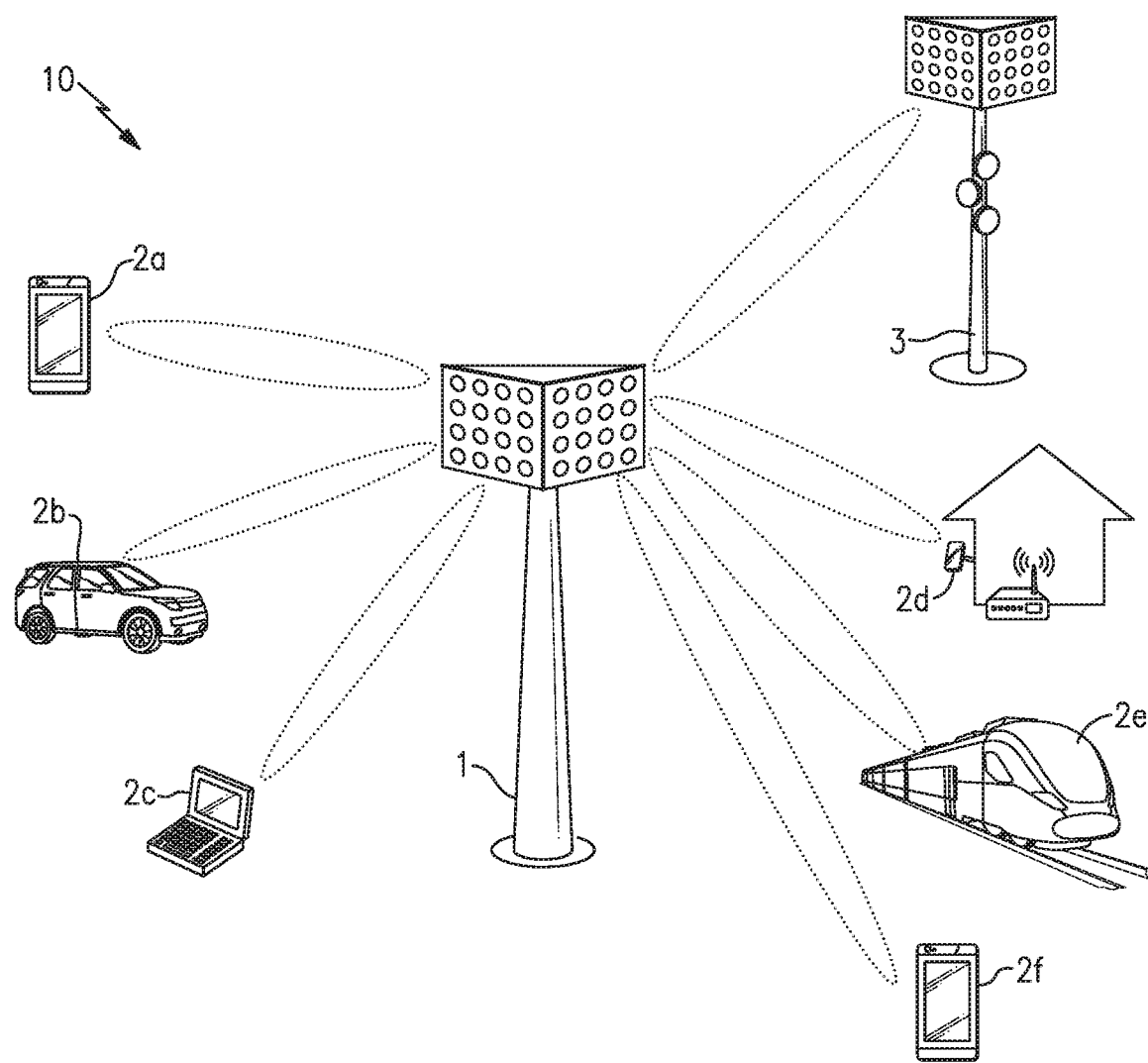
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, and a second mobile device 2f.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of technologies, including, for example, 4G LTE, 5G NR, and wireless local area network (WLAN), such as Wi-Fi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communication with a base station using one or more of 4G LTE, 5G NR, and Wi-Fi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed Wi-Fi frequencies).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Antenna Tuner with Integrated Antenna Multiplexer

Mobile devices can include aperture tuners, which can be placed between an antenna multiplexer and an antenna. However, even with inclusion of an aperture tuner, changes in antenna voltage standing wave ratio (VSWR) can exceed 10:1 during use. Mismatch loss can be greater than 3 decibels (dB).

The transfer function of an antenna multiplexer can be a strong function of or otherwise correlated to antenna impedance. Existing commercial antenna impedance tuners often exhibit high quantization error and/or insertion loss.

In order to provide improved operation, lower mismatch loss and lower VSWR variability, mobile devices in accordance with certain embodiments include an antenna impedance tuner that is integrated with an antenna multiplexer. Such a configuration can improve power gain by reducing losses between the impedance tuner and the antenna (which is a source of mismatch). Integration of the tuner and multiplexer can also achieve reduction in power amplifier saturation (Psat) and improved power amplifier performance stability as a function of VSWR, which can be determined by a phone user's grip and other obstacles in the near field of the antenna.

As will be described in greater detail, the antenna tuner can include a Pi network with discrete inductors and switches, e.g., to have substantially complete coverage over the Smith chart. The tuner circuit can be devised to reduce or minimize insertion loss while improving or maximizing the smith chart coverage.

Figure 2A:
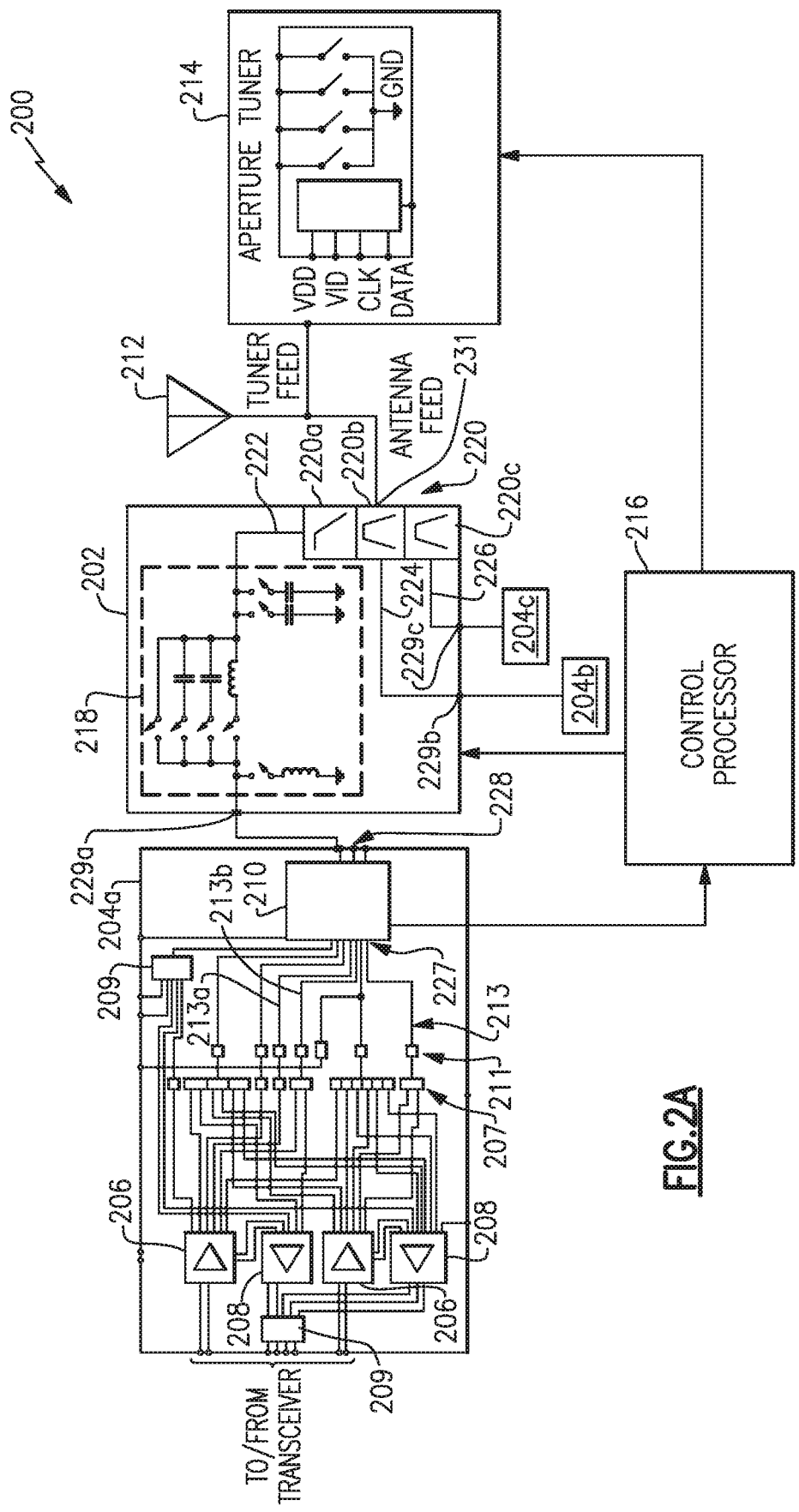
FIGS. 2A-2B are schematic diagrams of power amplifier systems having an antenna impedance tuner integrated with an antenna multiplexer.

FIG. 2A is a schematic diagram of an embodiment of a power amplifier system 200 having an integrated antenna impedance tuner/multiplexer 202.

The system 200 includes a tuner/multiplexer module 202, a plurality of front end modules 204a-204c, an antenna 212, an aperture tuner 214, and a control processor 216.

The control processor 216 can be any appropriate microprocessor. For example, in some implementations the system 200 is incorporated into a mobile phone or other mobile device, and the control processor 216 is an application processor or transceiver of the phone. Similarly, the antenna 212 can be any appropriate radio frequency antenna, such as an antenna of a mobile phone.

The front end modules 204a-204c generally include front-end componentry of a radio frequency device such as a mobile phone. In some implementations, each front end module 204a-204c corresponds to a different frequency band (e.g., low band, mid band, high band, ultra-high band, etc.) or different type of wireless communication protocol (e.g., different cellular technologies, Wi-Fi, Bluetooth, etc.). For example, in one embodiment, the modules 204a and 204b correspond to low and mid-band cellular technologies, respectively, and the module 204c corresponds to a Wi-Fi channel.

As shown, the front end module 204a includes a set of radio frequency componentry including power amplifiers 206, receive amplifiers 208, filters 207, switches 209, phase shifters 211, and an antenna switch module 210. While the internal componentry of the other front end modules 204b, 204c is not shown or described for the purposes of simplicity, it will be appreciated that these modules 204b, 204c can include similar types of components as the module 204a.

Figure 5:
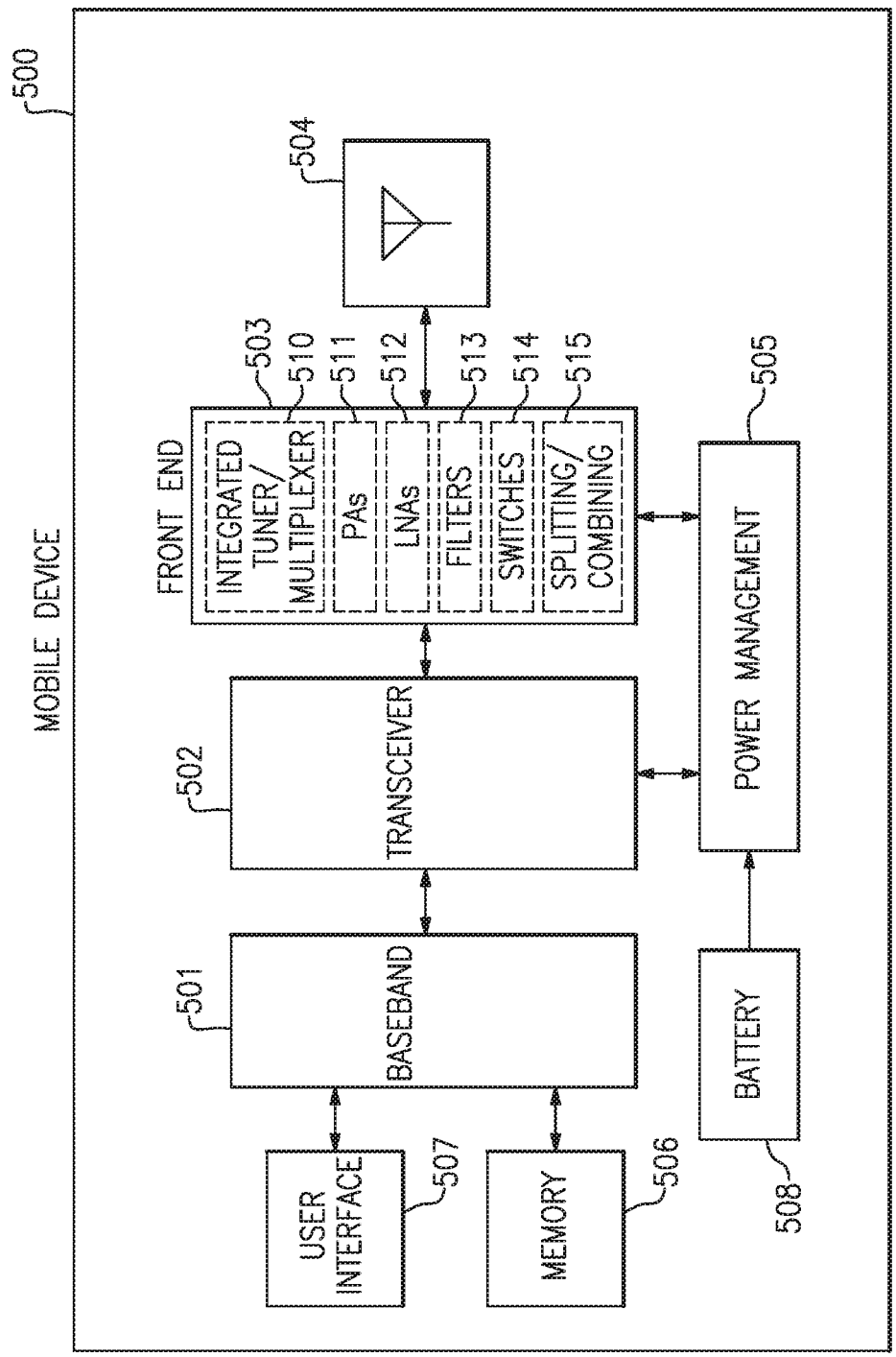
FIG. 5 is a schematic diagram of one embodiment of a mobile device including an antenna impedance tuner integrated with an antenna multiplexer.

The power amplifiers 206 can include one or more transistors configured to amplify radio frequency transmit signals received from a radio frequency transceiver (not shown, see FIG. 5 for an example of a compatible transceiver). The receive amplifiers 208 can be low noise amplifiers for example, configured to amplify receive signals detected by the antenna 212, and to transmit the amplified receive signal to the transceiver. The power amplifiers 206 and receive amplifiers 208 are connected with the antenna switch module 210 via transmit and receive paths 213, which can include one or more of the filters 207, switches 209 and phase shifters 211.

The filters 207 and switches 209 can be active components, passive components, or a combination thereof depending on the implementation. The filters 207 and switches 209 generally operate to pass the desired transmit signals and corresponding desired frequency content from the power amplifiers 206 to the antenna switch module 210 for eventual transmission via the antenna 212, and to pass the desired receive signals and corresponding desired frequency content from the antenna switch module 210 to the receive amplifiers 208, for eventual transmission to the transceiver. Depending on the configuration, the front end module 204a can be configured for FDD, TDD communication, or a combination thereof.

The antenna switch module 210 includes a network of switches, a plurality of front-end side ports 227 connected to the radio frequency signal paths 213 of the front end module 204a, and one or more antenna-side ports 228. Depending on the implementation, the signal paths can be transmit-only (e.g., path 213a), receive-only, transmit/receive (e.g., path 213b), or any combination thereof.

The switches of the antenna switch module 210 are selectively controllable (e.g., via the processor 216) to connect a selected radio frequency signal path onto a desired one of the multiplexer-side ports 228. For instance, the switches can be controlled to connect one of the front-end side ports 227 to the multiplexer-side port 228 connected to the tuner/multiplexer module 210, thereby connecting one of the radio frequency signal paths 213 to the impedance tuner/antenna multiplexer 202.

The front end module 204a can also include a directional coupler (not illustrated in FIG. 2A, see FIG. 5 for an example of a compatible coupler) configured to detect the transmit and/or receive signal power output by the front end module 204a. For example, in some implementations the coupler is integrated with the antenna switch module 210 and is configured to detect the transmit and/or receive signal power on the ports 227 and/or 228. For example, the coupler can be configured to sample signal power in forward and reverse directions. The sampled powers are detected and converted by an analog to digital converter (ADC) (not shown) to digital words that can be communicated (e.g., to the processor 216) and read via a digital interface such as MIPI.

The components of the front end module 204 can be included together in a packaged module. For example, the packaged module can include a combination of semiconductor dies, surface mounted components, and other appropriate components.

The tuner/multiplexer module 202 includes an antenna impedance tuner 218 and an antenna multiplexer 220, which can be integrated with one another such as by inclusion in a common module packaging. The illustrated tuner/multiplexer module 202 includes three front end-side ports 229a-c and an antenna-side port 231. The front end-side ports 229a-c are connected to the front end modules 204a-c, respectively, thereby connecting the tuner/multiplexer 220 module to the signal path 213 currently selected by the antenna switch module 210 of each of the front end modules 204a-204c.

The multiplexer 220 is configured to connect one or more of the signal branches 222, 224, 226 onto the antenna-side port 231. In particular, the illustrated multiplexer 220 includes a plurality of passive filters 220a-c which each pass a particular frequency band. For example, in some embodiments each of the filters 220a, 220b, 220c is configured to pass a different one of three different non-overlapping frequency bands. In this fashion, at any given time the multiplexer 220 can be configured to pass transmit signal content from some or all of the multiplexer branches 222, 224, 226 to the antenna-side port 231, e.g., for simultaneous transmission by the antenna 212 of power amplifier transmit signals from each the front end modules 204a-204c.

The tuner/multiplexer 202 can be configured for bi-directional communication. As such, the multiplexer 220 can also be configured to, at any given time, pass receive signal content detected by the antenna 212 to some or all of the branches 222, 224, 226 of the tuner/multiplexer 202, e.g., for simultaneous delivery of signals received by the antenna 212 to receive signal paths in each of the front end modules 204a-204c.

In some implementations, the antenna multiplexer 220 can include passive acoustic filters (e.g., surface acoustic wave or bulk acoustic wave filters) and/or lumped LC components. For example, one some embodiments the filters 220a, 220b, 220c of the multiplexer 220 include acoustic filters, and the components of the tuner 218 include surface mount inductors and capacitors.

The control processor 216 can control the aperture tuner 214 to adjust an electrical length of the aperture tuner 214, thereby improving the operation of the antenna 212. For example, the aperture tuner 214 can be adjusted to change the resonant frequency of the antenna 212.

However, as the impedance of the antenna 212 seen by the front end modules 204a-204c changes, the antenna 212 can be a source of mismatch, introducing losses between the front end modules 204a-204c and the antenna 212. The antenna impedance tuner 218 can reduce such losses. For example, the control processor 216 can control the antenna impedance tuner 218 to provide adjustable impedance matching and provide the antenna 212 as a matched load (e.g., 50 ohms) to the front end module 204a. For instance, the antenna impedance tuner 218 can be controlled to dynamically adjust the effective impedance of the antenna 212 seen by the front end module 204a as antenna VSWR changes. In this manner the impedance tuner 218 can improve power gain and reduce losses between the tuner 218 and the antenna 212.

The processor 216 can control the impedance tuner 218 based on samples of the transmit signal. For example, in some embodiments the processor 216 receives forward and reflected waves detected by the coupler in the front end module 204a, providing an indication of VSWR. The processor 216 can then control the impedance tuner 218 based on the detected VSWR according to a search algorithm to reduce or minimize impedance mismatch for the currently detected load. In particular, the control processor 216 can control the operation of the switches within the impedance tuner 218 to include or exclude desired capacitors and inductors in the impedance tuner 218, according to a desired algorithm.

For FDD communication, transmit and receive signals are communicated at the same time, and the impedance tuner 218 can therefore be adjusted identically for transmit and receive operation. For TDD communication, the transmit and receive signals are communicated during different time periods, and the control processor 216 can control the switches in the impedance tuner 218 to tune the impedance matching differently for transmit and receive windows, such as to account for different impedances in the transmit path versus the receive path.

While the impedance tuner 218 is only provided on branch 222 of the tuner/multiplexer module 202 in the illustrated embodiment, thereby providing impedance tuning for only the front end module 204a, in other implementations one or more of the other branches 224, 226 can also include an impedance tuner 218, thereby providing impedance tuning capability for the other front end modules 204b, 204c as well. A variety of topologies are possible for the impedance tuner 218. As one example, the impedance tuner 218 can include a pi-network of capacitors, inductors, and switches. Examples of some possible implementations are shown and described with respect to FIGS. 3A-3B.

Because the impedance tuner 218 and multiplexer 220 are integrated on the same module 202, the antenna impedance tuner 218 and the antenna multiplexer 220 can in some implementations share one or more components (e.g., one or more inductors or capacitors), saving area and cost.

Different arrangements are possible in other implementations. For example, in one embodiment, the components of the tuner/multiplexer module 202 are included in a common module with the front end module 204a. In another embodiment shown in FIG. 2B, the componentry of each of the front end modules 204a-204c as well as the tuner/multiplexer module 202 are included in a common module 230.

Figure 2B:
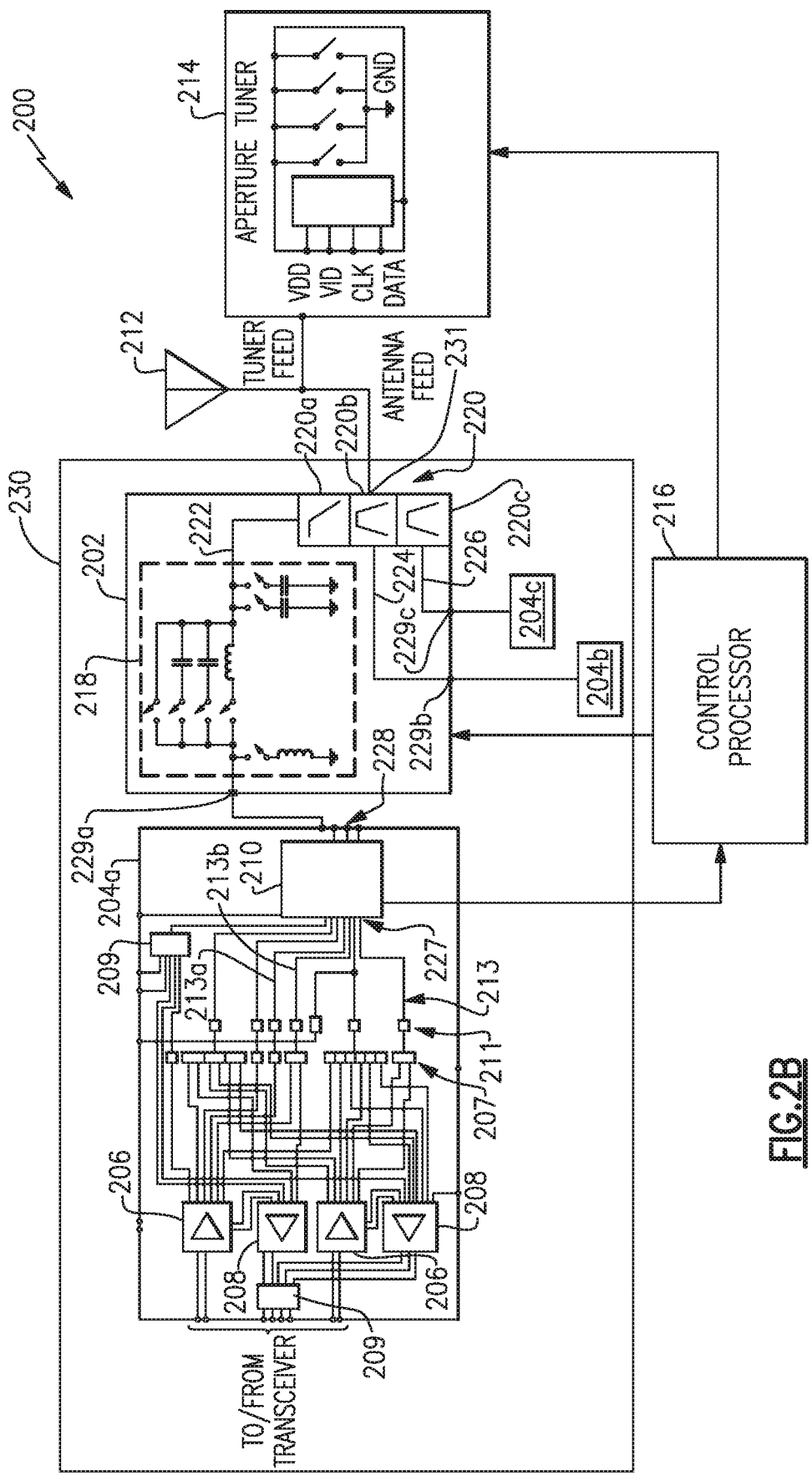
Figure 3A:
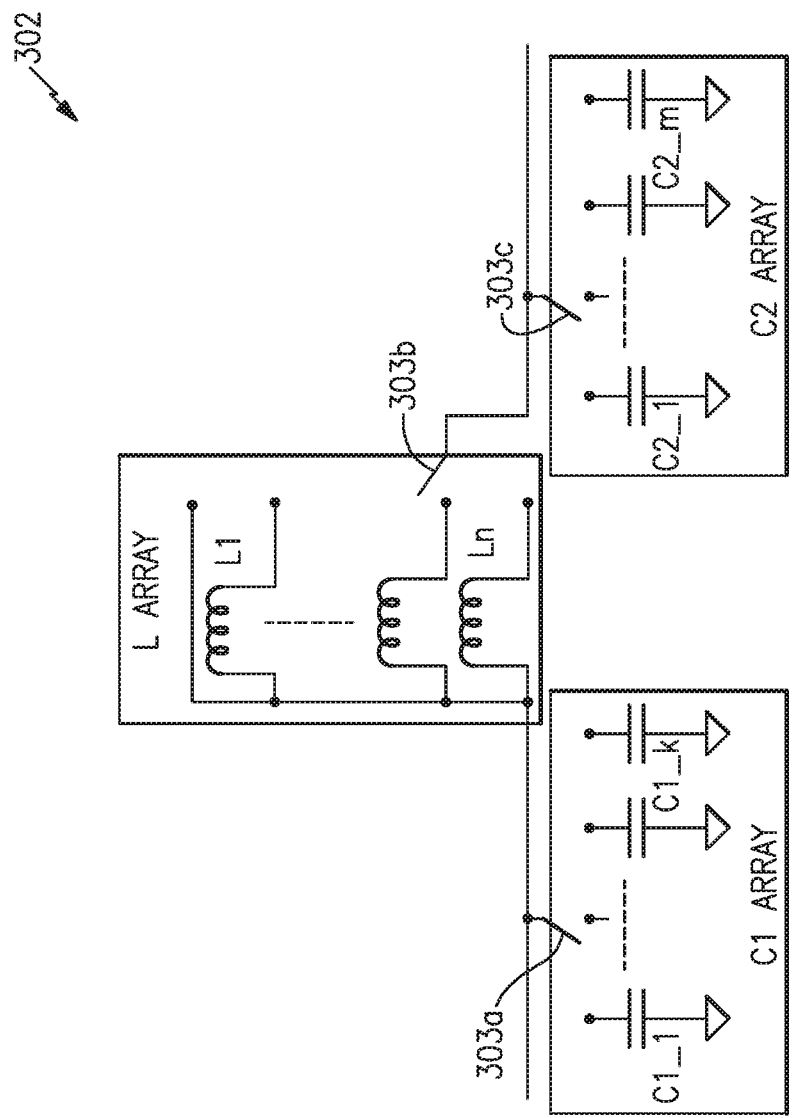
FIG. 3A is a schematic diagram of an embodiment of an antenna impedance tuner.

FIG. 3A is a schematic diagram of an embodiment of an antenna impedance tuner 302. For example, the tuner 302 can be implemented as the tuner 218 of the systems 200 shown in FIGS. 2A-2B, or in any of the other integrated tuner/multiplexers described herein. As shown, the antenna tuner 302 can include a Pi network. According to some embodiments, the network can have binary weighted or thermometer-coded values to match any load on a Smith chart with a VSWR<10. For example, the processor 218 can control the switches 303a-303c to control the configuration of the network, e.g., based on the input received from the coupler.

Figure 3B:
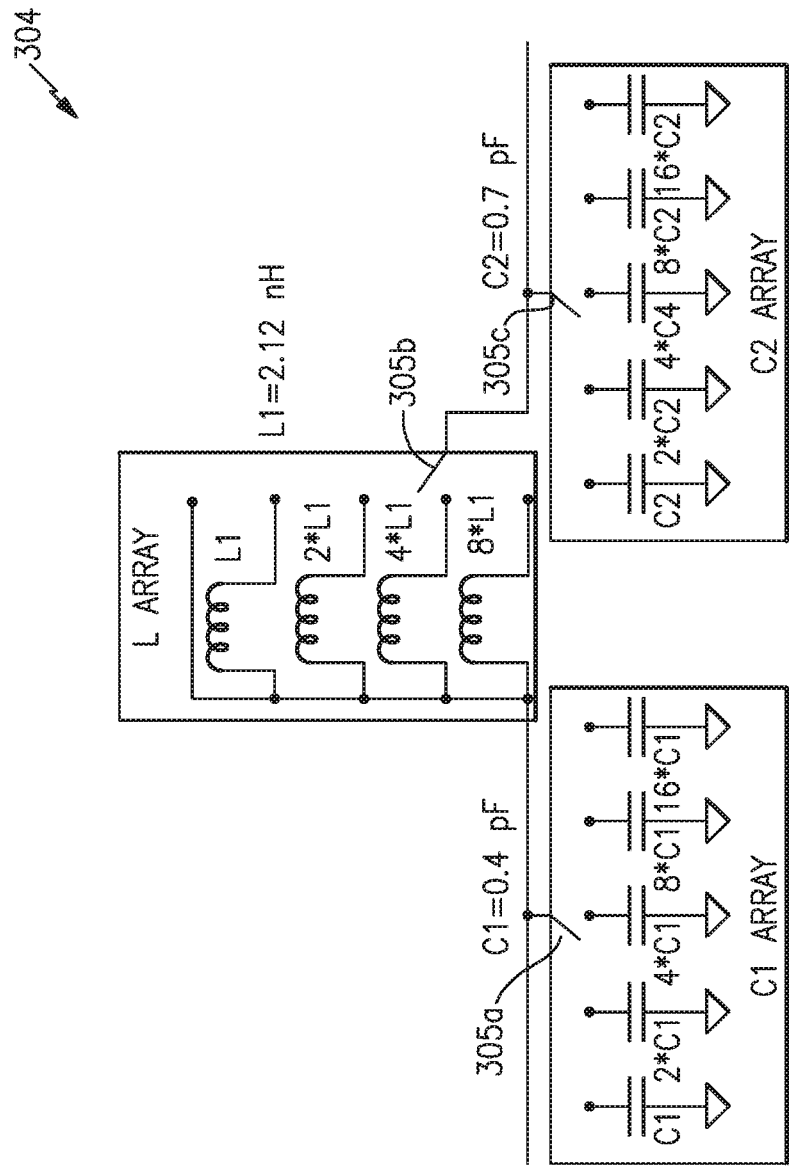
FIG. 3B is a schematic diagram of another embodiment of an antenna impedance tuner.

FIG. 3B is a schematic diagram of another embodiment of an antenna impedance tuner 304. The tuner 304 can be implemented as the tuner 218 of the system shown in FIGS. 2A-2B, or in any of the other integrated tuner/multiplexers described herein. For example, the processor 218 can control the switches 307a-307c to control the configuration of the network, based on the input received from the coupler.

The sample network of the illustrated tuner 304 can be a binary weighted 4 bit inductor with two 5 bit capacitor arrays.

Figure 4A:
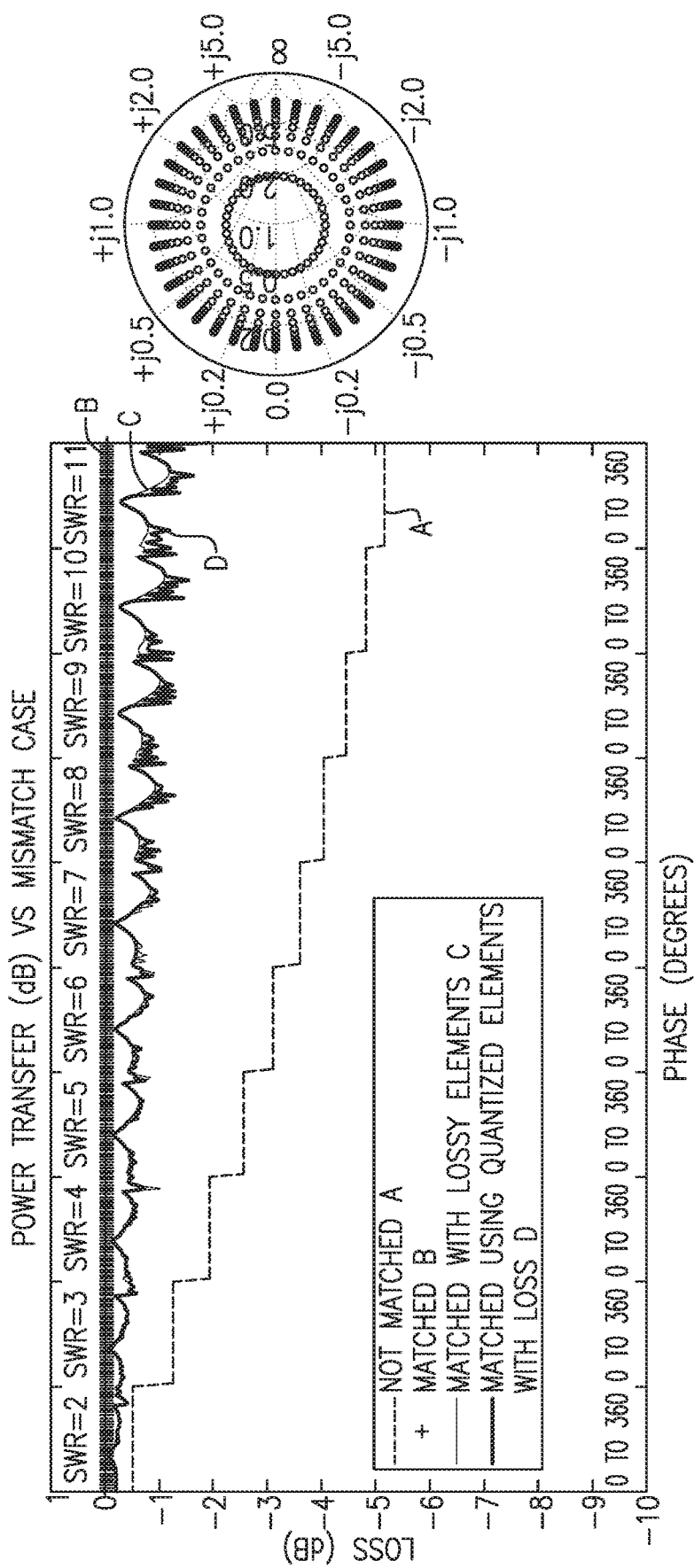
FIGS. 4A-4C are plots illustrating matching using different embodiments of an integrated antenna impedance tuner/multiplexer.
Figure 4B:
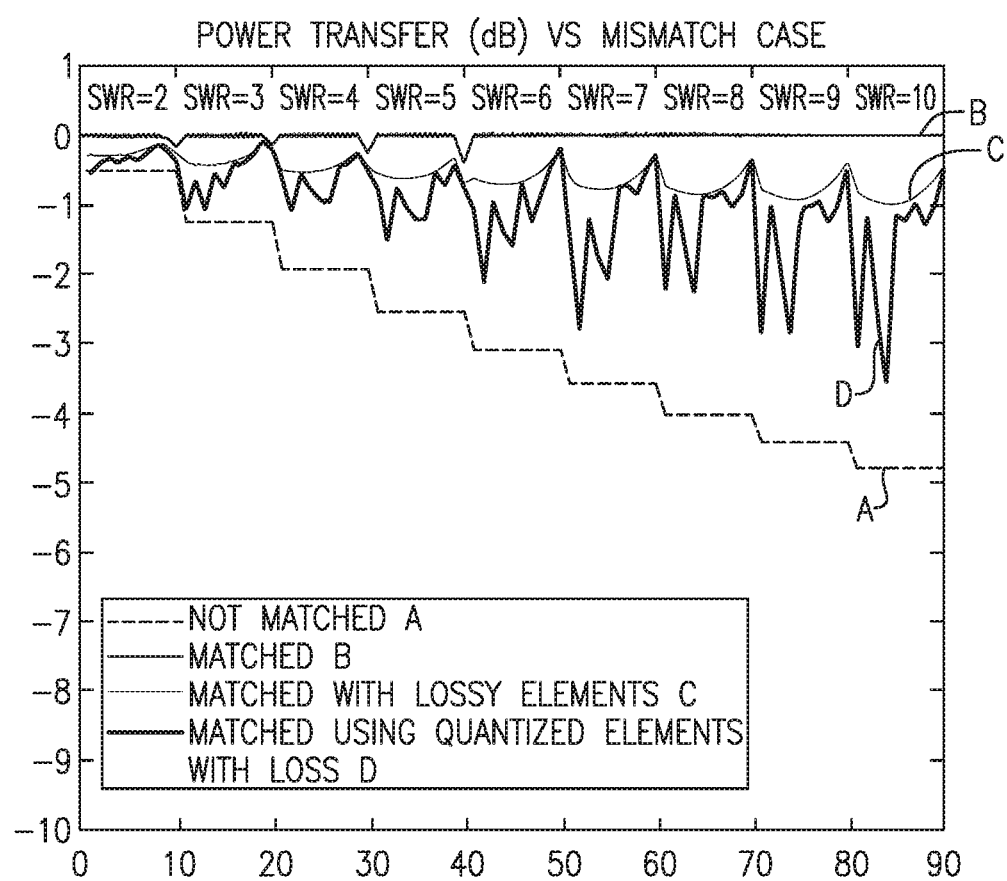
Figure 4C:
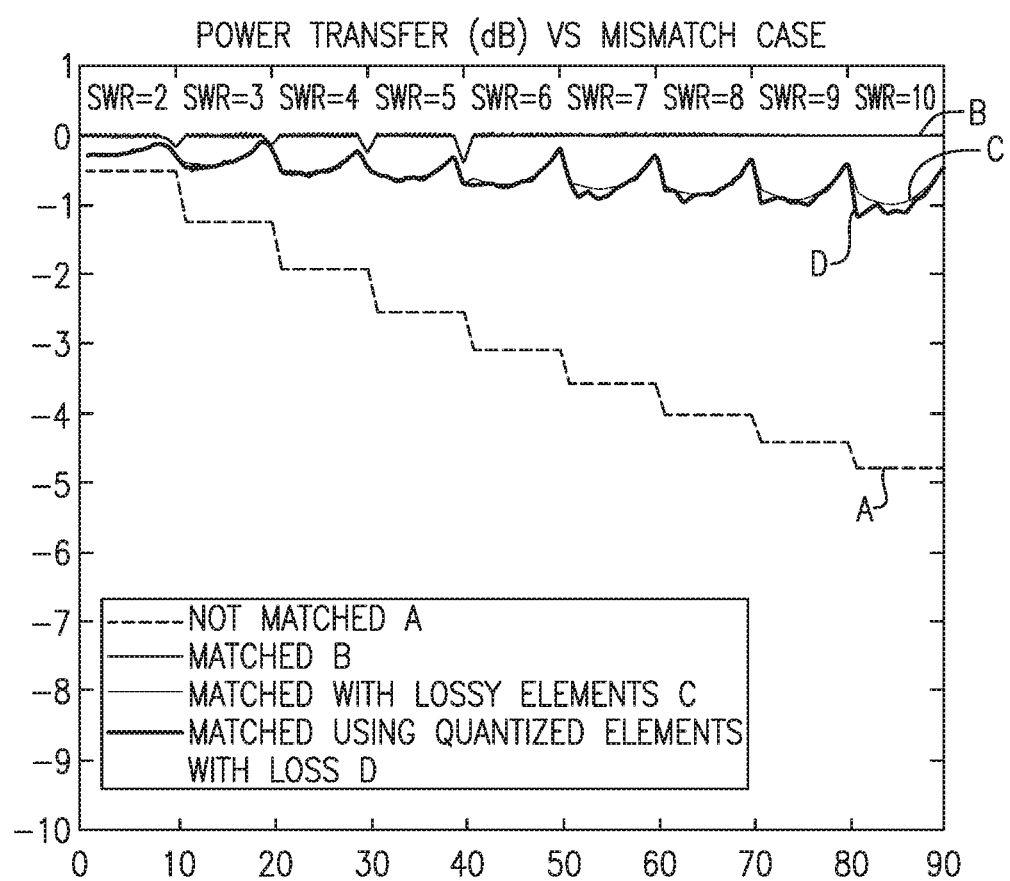

FIGS. 4A-4C are plots illustrating matching using different embodiments of an integrated antenna impedance tuner/multiplexer. FIG. 4A shows that the tuner of the integrated tuner/multiplexer can provide match error with less than 1 dB over all or substantially all impedances on the Smith chart with quantization error less than 0.5 dB. FIG. 4B shows that for a higher quantization error the size of the tuner can be reduced. FIG. 4C shows that quantization error can be reduced to negligible levels using a larger tuner.

The embodiments described herein including an integrated antenna impedance tuner/antenna multiplexer, such as those described with respect to FIGS. 2A-4C, are compatible with and can be incorporated into any of the systems described herein, including without any of the devices 2a-2f of FIG. 1, previously described, and any of the following which will now be described: the mobile device 500 of FIG. 5, the mobile devices 42 of FIGS. 6-7, the signal conditioning circuits 104a1-104mn of FIG. 8A, the signal conditioning devices 104a-b of FIGS. 8B-8C, or the modules 140 of FIGS. 9A-9B.

FIG. 5 is a schematic diagram of one embodiment of a mobile device 500 including antenna circuitry, which can include an integrated antenna tuner/multiplexer 510. The mobile device 500 includes a baseband system 501, a transceiver 502, a front end system 503, antennas 504, a power management system 505, a memory 506, a user interface 507, and a battery 508. The power amplifier systems 200 of either of FIGS. 2A-2B are compatible with the mobile device 500. For example, the integrated tuner/multiplexer 202, the aperture tuner 214, and the componentry of some or all of the front end modules 204a-204c of FIG. 2A or 2B can be incorporated into the front end system 503 of FIG. 5. While not shown in FIG. 5, mobile device 500 can further include an aperture tuner connected to the antenna 504, which may or may not be part of the front end 503. Similarly, the control processor 216 of FIG. 2A or 2B can be implemented by the transceiver 502 of FIG. 5. While the tuner/multiplexer 510 is illustrated as part of the front end 503, in some embodiments it the tuner/multiplexer 510 resides on a separate packaged module from some or all of the other components of the front end 503.

The mobile device 500 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 502 generates RF signals for transmission and processes incoming RF signals received from the antennas 504. It will be understood that various functionalities associated with the transmission and receiving of RF signals can be achieved by one or more components that are collectively represented in FIG. 5 as the transceiver 502. In one example, separate components (for instance, separate circuits or dies) can be provided for handling certain types of RF signals.

The front end system 503 aids is conditioning signals transmitted to and/or received from the antennas 504. In the illustrated embodiment, the front end system 503 includes antenna circuitry 510, which can include any of the integrated antenna tuner/multiplexers described herein, power amplifiers (PAs) 511, low noise amplifiers (LNAs) 512, filters 513, switches 514, and signal splitting/combining circuitry 515. However, other implementations are possible.

For example, the front end system 503 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 500 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 504 can include antennas used for a wide variety of types of communications. For example, the antennas 504 can include antennas for transmitting and/or receiving signals associated with a wide variety of frequencies and communications standards.

In certain implementations, the antennas 504 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 500 can operate with beamforming in certain implementations. For example, the front end system 503 can include amplifiers having controllable gain and phase shifters having controllable phase to provide beam formation and directivity for transmission and/or reception of signals using the antennas 504. For example, in the context of signal transmission, the amplitude and phases of the transmit signals provided to the antennas 504 are controlled such that radiated signals from the antennas 504 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 504 from a particular direction. In certain implementations, the antennas 504 include one or more arrays of antenna elements to enhance beamforming.

The baseband system 501 is coupled to the user interface 507 to facilitate processing of various user input and output (I/O), such as voice and data. The baseband system 501 provides the transceiver 502 with digital representations of transmit signals, which the transceiver 502 processes to generate RF signals for transmission. The baseband system 501 also processes digital representations of received signals provided by the transceiver 502. As shown in FIG. 5, the baseband system 501 is coupled to the memory 506 of facilitate operation of the mobile device 500.

The memory 506 can be used for a wide variety of purposes, such as storing data and/or instructions to facilitate the operation of the mobile device 500 and/or to provide storage of user information.

The power management system 505 provides a number of power management functions of the mobile device 500. In certain implementations, the power management system 505 includes a PA supply control circuit that controls the supply voltages of the power amplifiers 511. For example, the power management system 505 can be configured to change the supply voltage(s) provided to one or more of the power amplifiers 511 to improve efficiency, such as power added efficiency (PAE).

As shown in FIG. 5 the power management system 505 receives a battery voltage from the battery 508. The battery 508 can be any suitable battery for use in the mobile device 500, including, for example, a lithium-ion battery.

Figure 6:
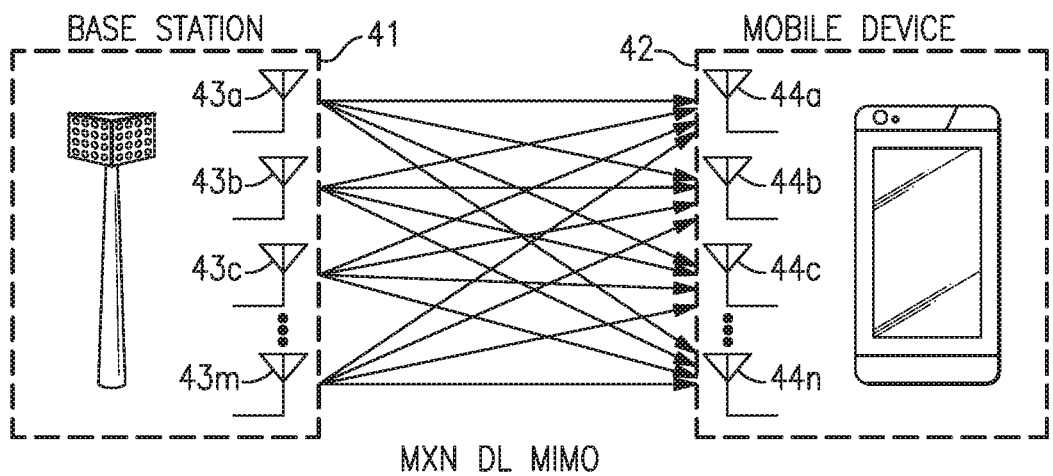
FIG. 6 is a schematic diagram of one example of a downlink channel using multi-input and multi-output (MIMO) communications.

FIG. 6 is a schematic diagram of one example of a downlink channel using multi-input and multi-output (MIMO) communications. FIG. 7 is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 6, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 6 illustrates an example of M×N DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

Figure 7:
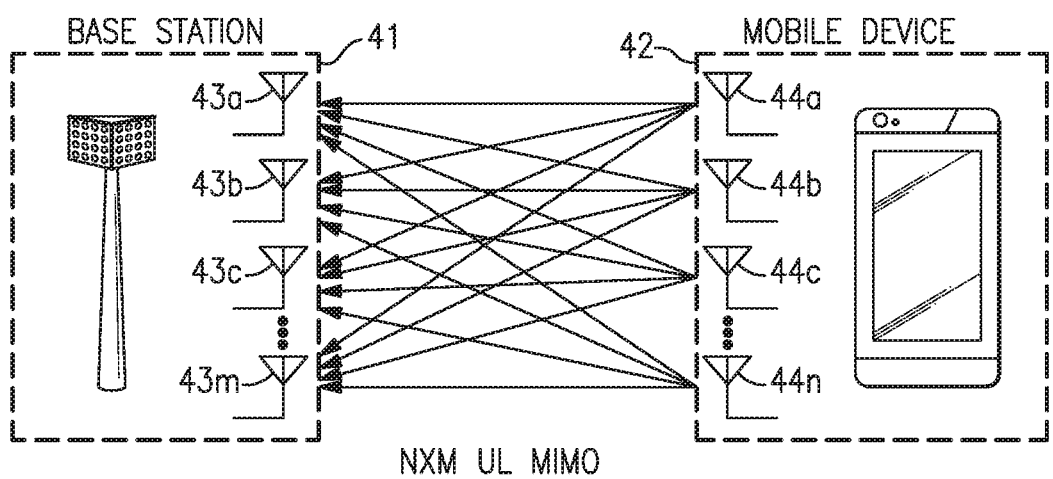
FIG. 7 is schematic diagram of one example of an uplink channel using MIMO communications.

In the example shown in FIG. 7, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 8B illustrates an example of N×M UL MIMO.

By increasing the level or order of MIMO, bandwidth of an uplink channel and/or a downlink channel can be increased.

MIMO communications are applicable to communication links of a variety of types, such as FDD communication links and TDD communication links.

One or more of the integrated antenna tuner/multiplexers described herein (e.g., the tuner/multiplexers 202 of FIGS. 2A-2B) can be implemented in the mobile device 42 and/or base station 41 of FIG. 6 or FIG. 7, and be configured to operate with any of the antennas 43a-m, 44a-n.

Figure 8A:
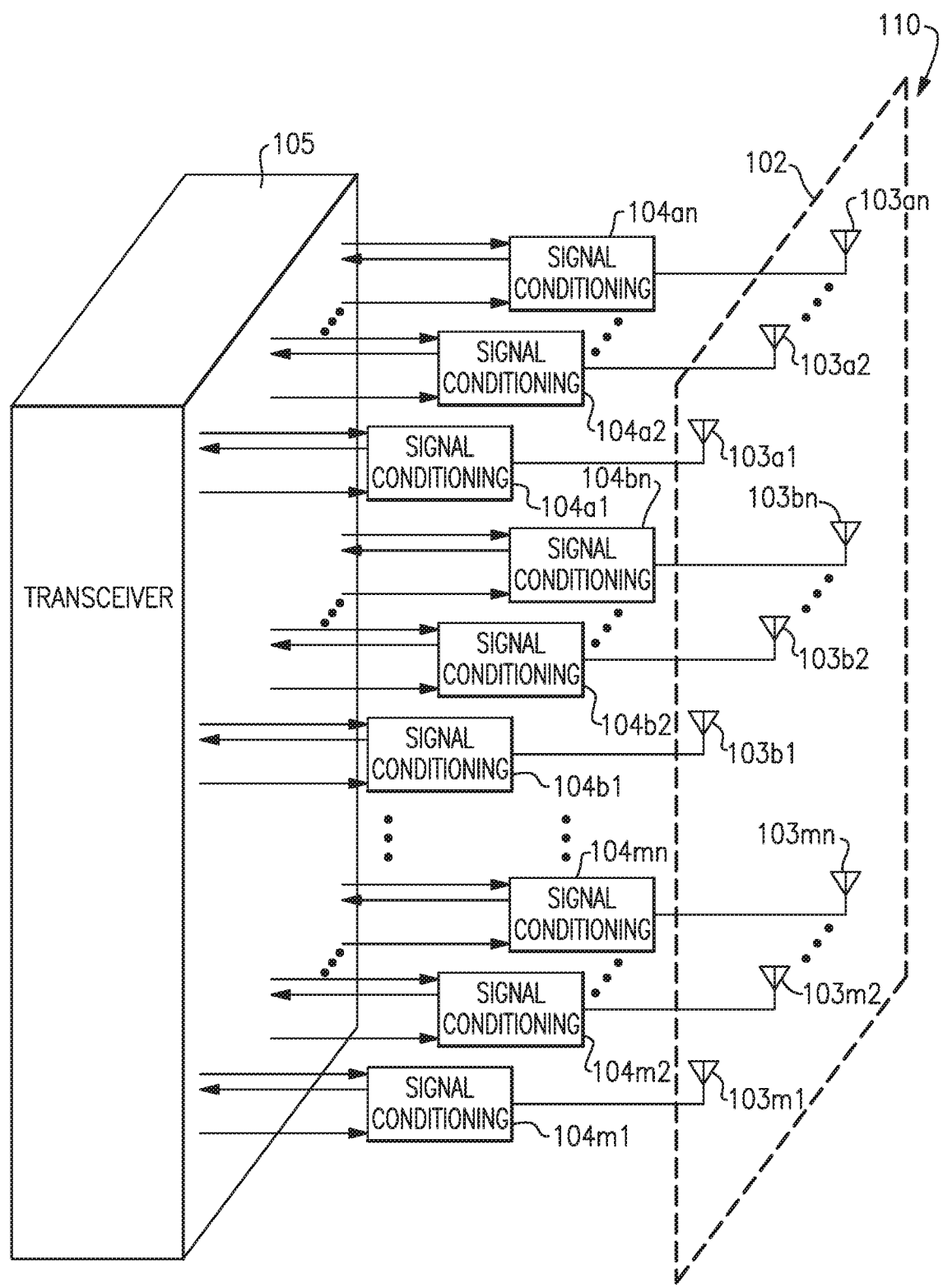
FIG. 8A is a schematic diagram of one example of a communication system that operates with beamforming.

FIG. 8A is a schematic diagram of one example of a communication system 110 that operates with beamforming. The communication system 110 includes a transceiver 105, signal conditioning circuits 104a1, 104a2 . . . 104an, 104b1, 104b2 . . . 104bn, 104m1, 104m2 . . . 104mn, and an antenna array 102 that includes antenna elements 103a1, 103a2 . . . 103an, 103b1, 103b2 . . . 103bn, 103m1, 103m2 . . . 103mn.

One or more of the integrated antenna tuner/multiplexers described herein (e.g., the tuner/multiplexers 202 of FIGS. 2A-2B) can be implemented in the system 110, such as by inclusion in one or more of the signal conditioning circuits 104a1-104mn, and configured for operation with one or more of the antennas elements 103a1-103mn in the array 102.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 8A, the transceiver 105 generates control signals for the signal conditioning circuits. The control signals can be used for a variety of functions, such as controlling the gain and phase of transmitted and/or received signals to control beamforming.

Figure 8B:
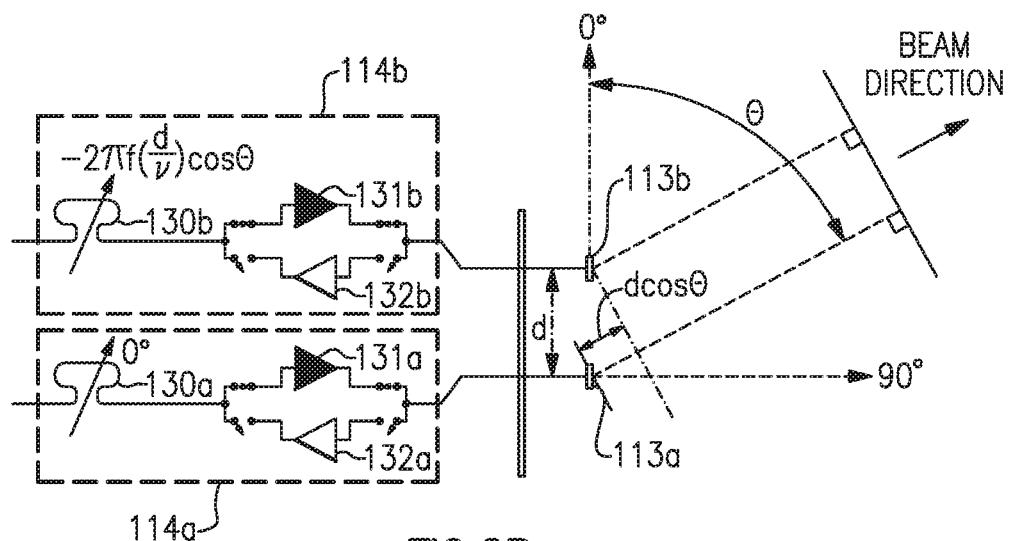
FIG. 8B is a schematic diagram of one example of beamforming to provide a transmit beam.

FIG. 8B is a schematic diagram of one example of beamforming to provide a transmit beam. FIG. 8B illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 8B illustrates one embodiment of a portion of the communication system 110 of FIG. 8A.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113a and the second antenna element 113b are separated by a distance d. Additionally, FIG. 8B has been annotated with an angle θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle θ can be achieved. For example, when the first phase shifter 130a has a reference value of 0°, the second phase shifter 130b can be controlled to provide a phase shift of about $-2\pi f(d/v)\cos\theta$ radians, where f is the fundamental frequency of the transmit signal, d is the distance between the antenna elements, v is the velocity of the radiated wave, and it is the mathematic constant pi.

In certain implementations, the distance d is implemented to be about $\frac{1}{2}\lambda$, where $\lambda$ is the wavelength of the fundamental component of the transmit signal. In such implementations, the second phase shifter 130b can be controlled to provide a phase shift of about $-\pi\cos\theta$ radians to achieve a transmit beam angle θ.

Accordingly, the relative phase of the phase shifters 130a, 130b can be controlled to provide transmit beamforming. In certain implementations, a baseband processor and/or a transceiver (for example, the transceiver 105 of FIG. 8A) controls phase values of one or more phase shifters and gain values of one or more controllable amplifiers to control beamforming.

Figure 8C:
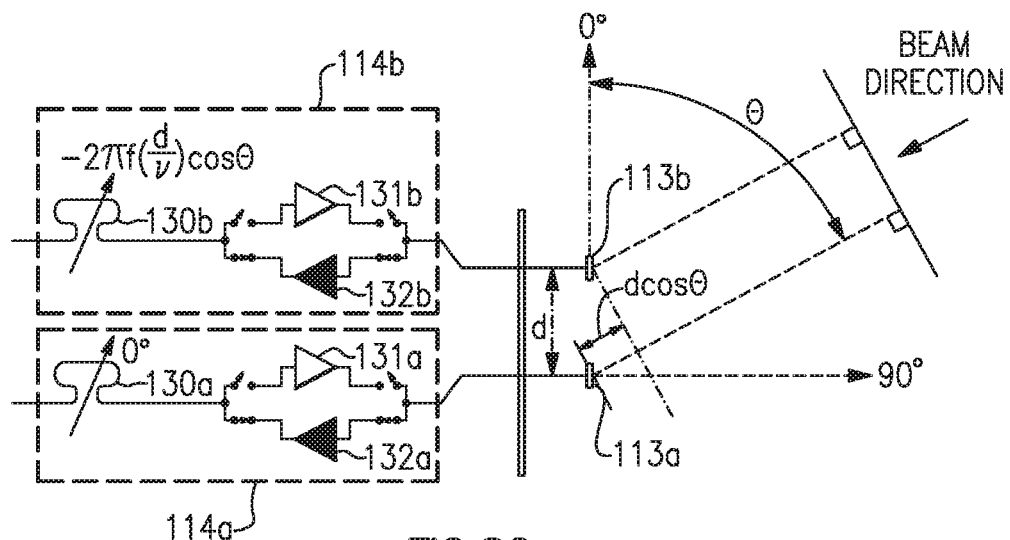
FIG. 8C is a schematic diagram of one example of beamforming to provide a receive beam.

FIG. 8C is a schematic diagram of one example of beamforming to provide a receive beam. FIG. 8C is similar to FIG. 8B, except that FIG. 8C illustrates beamforming in the context of a receive beam rather than a transmit beam.

As shown in FIG. 8C, a relative phase difference between the first phase shifter 130a and the second phase shifter 130b can be selected to about equal to $-2\pi f(d/v)\cos\theta$ radians to achieve a desired receive beam angle $\theta$. In implementations in which the distance d corresponds to about ½λ, the phase difference can be selected to about equal to $-\pi\cos\theta$ radians to achieve a receive beam angle $\theta$.

Although various equations for phase values to provide beamforming have been provided, other phase selection values are possible, such as phase values selected based on implementation of an antenna array, implementation of signal conditioning circuits, and/or a radio environment.

One or more of the integrated antenna tuner/multiplexers described herein (e.g., the tuner/multiplexers 202 of FIGS. 2A-2B) can be included in the signal conditioning circuits 114a, 114b of FIGS. 8B-8C, configured for operation with one or more of the antenna elements 113a, 113b.

Figure 9A:
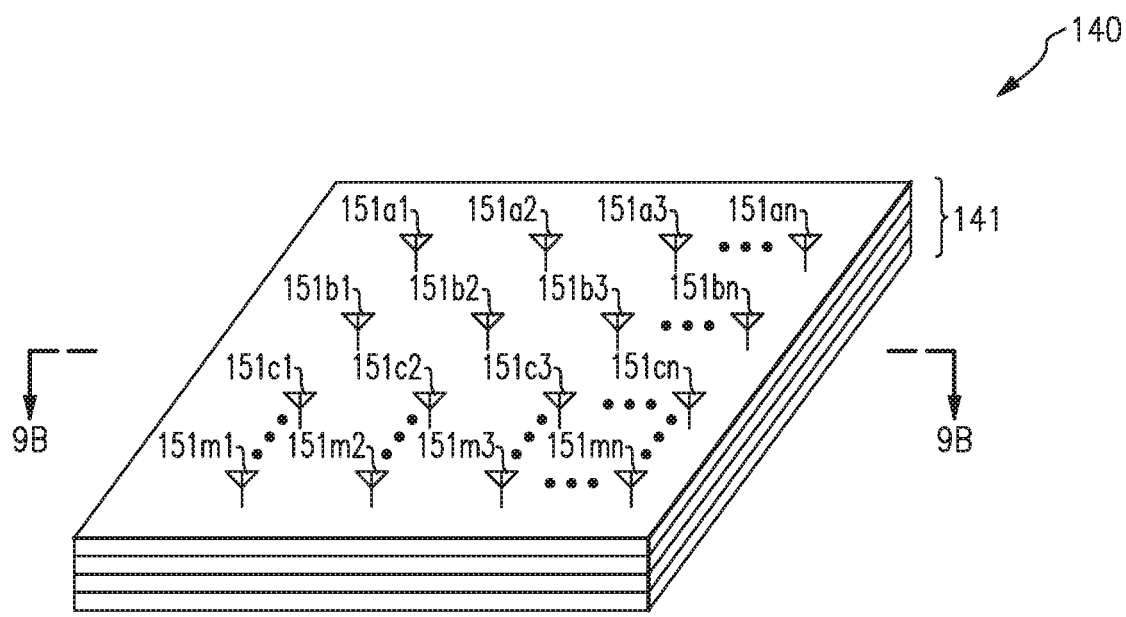
FIG. 9A is a perspective view of one embodiment of a module that operates with beamforming.

FIG. 9A is a perspective view of one embodiment of a module 140 that operates with beamforming. FIG. 9B is a cross-section of the module 140 of FIG. 9A taken along the lines 9B-9B.

The module 140 includes a laminated substrate or laminate 141, a semiconductor die or IC 142 (not visible in FIG. 9A), surface mount devices (SMDs) 143 (not visible in FIG. 9A), and an antenna array including antenna elements 151a1, 151a2, 151a3 . . . 151an, 151b1, 151b2, 151b3 . . . 151bn, 151c1, 151c2, 151c3 . . . 151cn, 151m1, 151m2, 151m3 . . . 151mn.

Figure 9B:
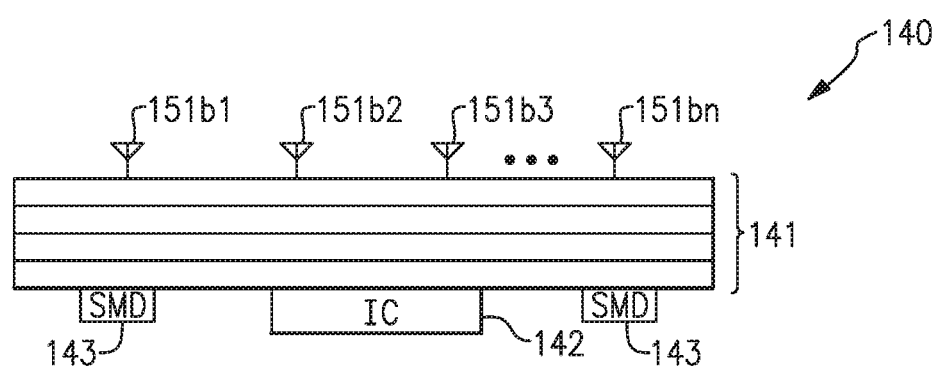
FIG. 9B is a cross-section of the module of FIG. 9A taken along the lines 9B-9B.

Although one embodiment of a module is shown in FIGS. 9A and 9B, the teachings herein are applicable to modules implemented in a wide variety of ways. For example, a module can include a different arrangement of and/or number of antenna elements, dies, and/or surface mount devices. Additionally, the module 140 can include additional structures and components including, but not limited to, encapsulation structures, shielding structures, and/or wirebonds.

The antenna elements antenna elements 151a1, 151a2, 151a3 . . . 151an, 151b1, 151b2, 151b3 . . . 151bn, 151c1, 151c2, 151c3 . . . 151cn, 151m1, 151m2, 151m3 . . . 151mn are formed on a first surface of the laminate 141, and can be used to receive and/or transmit signals, based on implementation. Although a 4×4 array of antenna elements is shown, more or fewer antenna elements are possible as indicated by ellipses. Moreover, antenna elements can be arrayed in other patterns or configurations, including, for instance, arrays using non-uniform arrangements of antenna elements. Furthermore, in another embodiment, multiple antenna arrays are provided, such as separate antenna arrays for transmit and receive and/or for different communication bands.

In the illustrated embodiment, the IC 142 is on a second surface of the laminate 141 opposite the first surface. However, other implementations are possible. In one example, the IC 142 is integrated internally to the laminate 141.

In certain implementations, the IC 142 includes signal conditioning circuits associated with the antenna elements 151a1, 151a2, 151a3 . . . 151an, 151b1, 151b2, 151b3 . . . 151bn, 151c1, 151c2, 151c3 . . . 151cn, 151m1, 151m2, 151m3 . . . 151mn. In one embodiment, the IC 142 includes a serial interface, such as a mobile industry processor interface radio frequency front-end (MIPI RFFE) bus and/or inter-integrated circuit (I2C) bus that receives data for controlling the signal conditioning circuits, such as the amount of phase shifting provided by phase shifters. In another embodiment, the IC 142 includes signal conditioning circuits associated with the antenna elements 151a1, 151a2, 151a3 . . . 151an, 151b1, 151b2, 151b3 . . . 151bn, 151c1, 151c2, 151c3 . . . 151cn, 151m1, 151m2, 151m3 . . . 151mn and an integrated transceiver.

The laminate 141 can include various structures including, for example, conductive layers, dielectric layers, and/or solder masks. The number of layers, layer thicknesses, and materials used to form the layers can be selected based on a wide variety of factors, and can vary with application and/or implementation. The laminate 141 can include vias for providing electrical connections to signal feeds and/or ground feeds of the antenna elements. For example, in certain implementations, vias can aid in providing electrical connections between signal conditioning circuits of the IC 142 and corresponding antenna elements.

The antenna elements 151a1, 151a2, 151a3 . . . 151an, 151b1, 151b2, 151b3 . . . 151bn, 151c1, 151c2, 151c3 . . . 151cn, 151m1, 151m2, 151m3 . . . 151mn can correspond to antenna elements implemented in a wide variety of ways. In one example, the array of antenna elements includes patch antenna element formed from a patterned conductive layer on the first side of the laminate 141, with a ground plane formed using a conductive layer on opposing side of the laminate 141 or internal to the laminate 141. Other examples of antenna elements include, but are not limited to, dipole antenna elements, ceramic resonators, stamped metal antennas, and/or laser direct structuring antennas.

The module 140 can be included a communication system, such as a mobile phone or base station. In one example, the module 140 is attached to a phone board of a mobile phone.

Applications

The principles and advantages of the embodiments described herein can be used for a wide variety of applications.

For example, power amplifier systems can be included in a wide range of radio frequency electronics including, but not limited to, a base station, a wireless network access point, a mobile phone (for instance, a smartphone), a tablet, a vehicle, a computer, and/or an Internet of things (IoT) device.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio frequency module, comprising:
    at least first and second front-end signal module ports configured for connection to first and second radio frequency front ends;
    an antenna signal module port configured for connection to an antenna;
    first and second antenna impedance tuners each including tuning circuitry controllable to provide adjustable impedance matching;
    an antenna multiplexer integrated with the first and second antenna impedance tuners and positioned between the first and second antenna impedance tuners and the antenna signal module port, the antenna multiplexer including at least first and second non-antenna side ports and an antenna-side port coupled to the antenna signal module port, the multiplexer configured to couple the antenna-side port to one or more of the first and second non-antenna side ports, the first antenna impedance tuner connected between the first front-end signal module port and the first non-antenna side port of the antenna multiplexer, and the second antenna impedance tuner connected between the second front-end signal module port and the second non-antenna side port of the antenna multiplexer; and
    a module packaging housing the antenna multiplexer and the first and second antenna impedance tuners.

2. The module of claim 1 wherein the first antenna impedance tuner is configured to provide adjustable impedance matching between the antenna coupled to the antenna signal module port and an output of a power amplifier that generates a radio frequency transmit signal received on the first front-end signal module port.

3. The module of claim 1 further comprising at least one control module port configured to receive one or more control signals, the tuning circuitry of each of the first and second antenna impedance tuners including a plurality of switches configured to switch in response to the control signals to adjust the impedance matching.

4. The module of claim 1 wherein the antenna multiplexer is a multiplexer/demultiplexer configured to multiplex in a transmit direction and demultiplex in a receive direction.

5. The module of claim 1 wherein one or both of the first and second antenna impedance tuners includes a pi network.

6. The module of claim 1 wherein the antenna multiplexer includes a separate filter for each of the first and second non-antenna side ports, each filter configured to pass a different range of frequency content.

7. A mobile device, comprising:
    an antenna;
    first and second power amplifiers configured to output amplified first and second radio frequency transmit signals;
    a packaged module including at least first and second front-end signal module ports configured for connection to receive the amplified first and second radio frequency transmit signals, an antenna signal module port configured for connection to an antenna, first and second antenna impedance tuners each including tuning circuitry-controllable to provide adjustable impedance matching, and an antenna multiplexer integrated with the first and second antenna impedance tuners and positioned between the first and second antenna impedance tuners and the antenna signal module port, the antenna multiplexer including at least first and second non-antenna side ports and an antenna-side port coupled to the antenna signal module port, the multiplexer configured to couple the antenna-side port to one or more of the first and second non-antenna side ports, the first antenna impedance tuner connected between the first front-end signal module port and the first non-antenna side port of the antenna multiplexer, and the second antenna impedance tuner connected between the second front-end signal module port and the second non-antenna side port of the antenna multiplexer.

8. The mobile device of claim 7 further comprising a directional coupler coupled in a radio frequency communication path between the power amplifier and the first antenna impedance tuner.

9. The mobile device of claim 8 further comprising a processor configured to control the first antenna impedance tuner to adjust the impedance matching, based on signals received from the directional coupler.

10. The mobile device of claim 7 further comprising an aperture tuner coupled to the antenna.

11. The mobile device of claim 7 wherein one or both of the first antenna impedance tuner and the second antenna impedance tuner includes a pi network.

12. The mobile device of claim 7 wherein the antenna multiplexer is a multiplexer/demultiplexer configured to multiplex in a transmit direction and demultiplex in receive direction.

13. The mobile device of claim 7 further comprising a first antenna switch module connected between the first power amplifier and the packaged module, and a second antenna switch module connected between the second power amplifier and the packaged module.

14. The mobile device of claim 13 wherein the first power amplifier and the first antenna switch module reside on a first radio frequency front end module separate from the packaged module, and the second power amplifier and the second antenna switch module reside on a second radio frequency front end module separate from the packaged module.

15. A radio frequency module, comprising:
an antenna signal module port;
first and second power amplifiers configured to amplify first and second radio frequency transmit signals;
first and second antenna impedance tuners each including tuning circuitry controllable to provide adjustable impedance matching; and
an antenna multiplexer integrated with the first and second antenna impedance tuners and positioned between the first and second antenna impedance tuners and the antenna signal module port, the antenna multiplexer including at least first and second non-antenna side ports and an antenna-side port coupled to the antenna signal module port, the multiplexer configured to couple the antenna-side port to one or more of the first and second non-antenna side ports, the first antenna impedance tuner connected between the first power amplifier and the first non-antenna side port of the antenna multiplexer, and the second antenna impedance tuner connected between the second power amplifier and the second non-antenna side port of the antenna multiplexer; and
a module packaging housing the first and second power amplifiers, the antenna multiplexer and the first and second antenna impedance tuners.

16. The module of claim 15 wherein the first and second antenna impedance tuners are configured to provide adjustable impedance matching between an antenna coupled to the antenna signal module port and outputs of the first and second power amplifiers.

17. The module of claim 15 further comprising at least one control module port configured to receive one or more control signals, the tuning circuitry of each of the first and second antenna impedance tuners including a plurality of switches configured to switch in response to the control signals to adjust the impedance matching.

18. The module of claim 15 wherein the antenna multiplexer is a multiplexer/demultiplexer configured to multiplex in a transmit direction and demultiplex in a receive direction.

19. The module of claim 15 wherein one or both of the first and second antenna impedance tuners includes a pi network.

* * * * *